United States Patent
Marukawa

(10) Patent No.: US 11,153,983 B2
(45) Date of Patent: Oct. 19, 2021

(54) POWER CONTROL UNIT AND METHOD OF ASSEMBLING THE SAME

(71) Applicant: TOYOTA JIDOSHA KABUSHIKI KAISHA, Toyota (JP)

(72) Inventor: Naoki Marukawa, Numazu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/912,211

(22) Filed: Jun. 25, 2020

(65) Prior Publication Data

US 2021/0059062 A1 Feb. 25, 2021

(30) Foreign Application Priority Data

Aug. 23, 2019 (JP) .............................. JP2019-153056

(51) Int. Cl.
| | |
|---|---|
| *H05K 5/00* | (2006.01) |
| *H05K 5/02* | (2006.01) |
| *H05K 5/03* | (2006.01) |
| *H05K 7/14* | (2006.01) |
| *B60L 15/20* | (2006.01) |

(52) U.S. Cl.
CPC .............. *H05K 5/0217* (2013.01); *H05K 5/03* (2013.01); *H05K 7/1427* (2013.01); *B60L 15/20* (2013.01)

(58) Field of Classification Search
USPC ......................................................... 361/752
See application file for complete search history.

(56) References Cited

U.S. PATENT DOCUMENTS

| | | | | |
|---|---|---|---|---|
| 6,621,701 | B2 * | 9/2003 | Tamba | H05K 7/20927 165/80.4 |
| 7,952,856 | B2 * | 5/2011 | Otsuka | B60W 10/08 361/624 |
| 10,259,339 | B1 * | 4/2019 | Miura | B60L 3/0061 |
| 2020/0161993 | A1 * | 5/2020 | Kishimoto | H02K 9/19 |

FOREIGN PATENT DOCUMENTS

JP 2009-051234 A 3/2009

* cited by examiner

*Primary Examiner* — Hung S. Bui
(74) *Attorney, Agent, or Firm* — Sughrue Mion, PLLC

(57) ABSTRACT

A power control unit is disposed on a transaxle case and includes: a plurality of semiconductor devices; an electronic circuit board including a soldered portion for attaching the plurality of semiconductor devices; and a PCU case formed to house the plurality of semiconductor devices and the electronic circuit board. The PCU case includes a support member to which the plurality of semiconductor devices are attached, and an upper cover forming at least a part of an upper surface of the PCU case. The upper cover includes a first component and one or more second components having a lower rigidity than the first component. The electronic circuit board is attached to the first component. The soldered portion is arranged on a surface of the electronic circuit board on the upper cover side. At least one of the one or more second components is arranged to cover the soldered portion.

6 Claims, 11 Drawing Sheets

Process A

Process B

Process C

Process D

Process E

POWER CONTROL UNIT AND METHOD OF ASSEMBLING THE SAME

CROSS-REFERENCE TO RELATED APPLICATION

The present disclosure claims priority under 35 U.S.C. § 119 to Japanese Patent Application No. 2019-153056, filed on Aug. 23, 2019. The content of which is incorporated herein by reference in its entirety.

BACKGROUND

Technical Field

The present disclosure relates to a power control unit and a method of assembling the same, and more particularly to a power control unit applied to an electrified vehicle and a method of assembling the same.

Background Art

For example, JP 2009-051234 A discloses a mounting structure of a vehicle drive device applied to an electrified vehicle. This mounting structure is provided with a drive unit, an electric device and a cover member. The drive unit uses the motive power of a rotating electrical machine to drive the vehicle. The electric device (a power control unit (PCU)) is disposed above the drive unit to control the drive unit. The cover member covers the upper side of the PCU. In addition, the cover member includes a first portion for absorbing the radiated noise (gear noise) from the drive unit, a second portion for absorbing the electromagnetic waves from the PCU, and a third portion for damping the vibration of the PCU.

SUMMARY

As disclosed in JP 2009-051234 A, a power control unit (PCU) of an electrified vehicle may be disposed on a transaxle case housing at least one of a rotating electrical machine and gears. In a PCU case of the power control unit, a plurality of semiconductor devices (or a semiconductor module) and an electronic circuit board including a soldered portion for attaching the semiconductor module may be housed. Moreover, the PCU case may include an upper cover formed to configure at least a part of an upper surface of the PCU case. It is desirable that, in addition to reducing the vibration of the upper cover generated by a vehicle drive unit, the power control unit having this kind of configuration can address the following problem.

If it is possible to adopt a structure in which the electronic circuit board is attached to the upper cover, there is an advantage such that a space inside the PCU case can be effectively used. However, if the upper cover is configured by a single component, there is a concern that, in order to allow the semiconductor module to be soldered with the electronic circuit board, the choices of arrangement of the components built into the PCU case may be limited.

The present disclosure has been made to address the problem described above, and an object of the present disclosure is to provide a power control unit and a method of assembling the same, which can increase the flexibility in power control unit design together with the vibration reduction of an upper cover of a power control unit case (PCU case).

A power control unit according to the present disclosure is applied to an electrified vehicle driven by a vehicle drive unit including a transaxle case that houses at least one of a rotating electrical machine and gears. The power control unit is disposed on the transaxle case and includes: a plurality of semiconductor devices configured to perform an electric power control of the rotating electrical machine; an electronic circuit board including a soldered portion for attaching the plurality of semiconductor devices to the electronic circuit board; and a power control unit case (PCU case) formed to house the plurality of semiconductor devices and the electronic circuit board. The PCU case includes a support member to which the plurality of semiconductor devices are attached, and an upper cover that forms at least a part of an upper surface of the PCU case. The upper cover includes a first component and one or more second components having a lower rigidity than the first component. The electronic circuit board is attached to the first component. The soldered portion is arranged on a surface of the electronic circuit board located on a side of the upper cover. At least one of the one or more second components is arranged to cover the soldered portion.

A difference in rigidity between the first component and the one or more second components may be given in such a manner that a natural vibration frequency of the first component is higher than the following threshold value. The threshold value is a lower limit frequency value of an attenuation area in which a vibration transmissibility of the one or more second components is less than or equal to 0 dB.

The one or more second components may be formed of a material having a lower rigidity than that of the first component.

The one or more second components may have a smaller thickness than the first component.

The first component may include a rib configured to increase rigidity of the first component while the one or more second components may not include ribs to increase rigidity of the one or more second components.

Moreover, a method of assembling the power control unit according to the present disclosure includes: attaching the plurality of semiconductor devices to the support member, attaching the electronic circuit board to the first component; stacking the electronic circuit board attached to the first component and the plurality of semiconductor devices attached to the support member; performing soldering of the electronic circuit board and the plurality of semiconductor devices which have been stacked; and assembling the one or more second components with the first component after the soldering.

According to the power control unit of the present disclosure, the upper cover of the PCU case includes the first component and the one or more second components that we separated from each other, and a difference in rigidity is given between the first component and the one or more second components. Thus, the natural vibration frequencies (resonant frequencies) of these first and second components can be dispersed. As a result, the vibration area (the area of a noise emitting surface) at the resonance at each natural vibration frequency can be reduced as compared to the vibration area at resonance at a single natural vibration frequency in an example with an upper cover formed by a single component. Therefore, it is possible to reduce the vibration and noise with the upper casas the noise emitting surface. Furthermore, according to the power control unit of the present disclosure, even after the electronic circuit board is attached to the first component and the plurality of semiconductor devices are stacked on the electronic circuit board, the soldering work of the soldered portion can be performed from the outer surface side of the upper cover before the soldered portion is covered by the one or more second component. Therefore, it becomes possible to adopt a structure in which the electronic circuit board is attached to the first component on the higher rigidity side before the plurality of semiconductor devices are stacked on the electronic circuit board. This leads to an increased flexibility of power control unit design.

DETAILED DESCRIPTION

Figure 1:
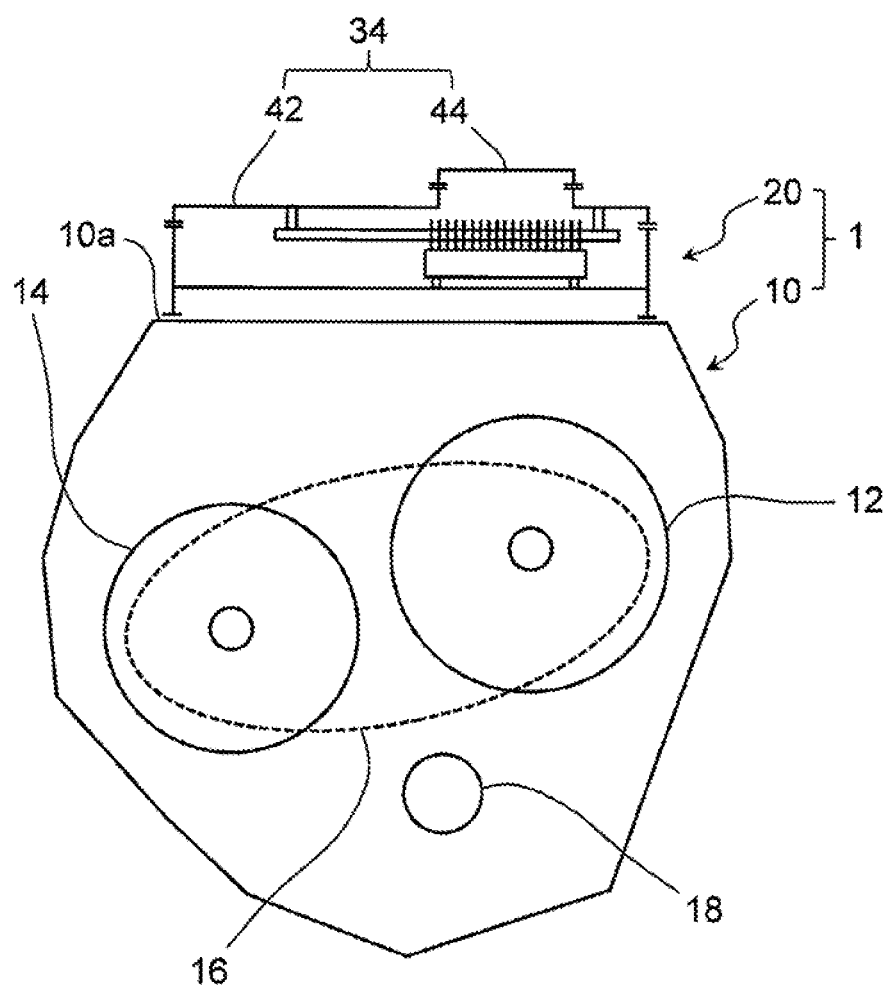
FIG. 1 is a diagram schematically showing an example of a mounting structure of a power control unit according to a first embodiment of the present disclosure.

In the following embodiments of the present disclosure, the same components in the drawings are denoted by the same reference numerals, and redundant descriptions thereof are omitted or simplified. Moreover, it is to be understood that even when the number, quantity, amount, range or other numerical attribute of an element is mentioned in the following description of the embodiments, the present disclosure is not limited to the mentioned numerical attribute unless explicitly described otherwise, or unless the present disclosure is explicitly specified by the numerical attribute theoretically. Furthermore, structures or the like that are described in conjunction with the following embodiments are not necessarily essential to the present disclosure unless explicitly shown otherwise, or unless the present disclosure is explicitly specified by the structures or the like theoretically.

1. First Embodiment

A first embodiment and first and second modification examples according to the present disclosure will be described with reference to FIGS. 1 to 10.

1-1. Mounting Structure of Power Control Unit

FIG. 1 is a diagram schematically showing an example of a mounting structure of a power control unit 20 according to the first embodiment. The configuration shown in FIG. 1 includes a vehicle drive unit 1 for driving an electrified vehicle. It should be noted that, in FIG. 1 and also FIG. 11 to be described below, the upper side of each drawing sheet corresponds to the upper side of the electrified vehicle.

The vehicle driving unit 1 includes, as an example, a transaxle case (T/A case) 10 formed to house both rotating electrical machines and gears. It should be noted that the T/A case 10 is, for example, made of metal, such as aluminum.

The term "rotating electrical machine" mentioned here means a machine having at least one of functions of an electric motor and a generator. In the example of the T/A case 10, two motor generators 12 and 14 having both functions of an electric motor and a generator are included as the rotating electrical machine used for driving the electrified vehicle. The motor generator 12 is mainly used as an electric motor for driving the electrified vehicle and is hereinafter simply referred to as an electric motor 12. On the other hand, the motor generator 14 is mainly used as a generator for generating electric power using the power (motive power) of an internal combustion engine (not shown) and is hereinafter simply referred to as a generator 14.

Moreover, in the example of the T/A case 10, the gears for transmitting the motive power to vehicle wheels (not shown) include a power split device (planetary gear unit) 16 and a differential gear 18. One of the functions of this power split device 16 is to split the power of the internal combustion engine into a path for driving the vehicle and a path for driving the generator 14. The power of the electric motor 12 and the power of the internal combustion engine are transmitted to the vehicle wheels via the power split device 16 and the differential gear 18. That is to say, the electrified vehicle in this example is a hybrid vehicle. It should be noted that, instead of this kind of hybrid vehicle, the electrified vehicle according to the present disclosure may be, for example, a battery electric vehicle without including an internal combustion engine.

The vehicle drive unit 1 further includes a power control unit (PCU) 20. The PCU 20 is a power converter for controlling the electric motor 12 and the generator 14. The PCU 20 is disposed on the T/A case 10. In more detail, in the example of the mounting structure shown in FIG. 1, the vehicle drive unit 1 has an electromechanical integrated structure in which the PCU 20 and the T/A case 10 are directly fastened to each other by fasteners, such as bolts.

1-2. Configuration of PCU

Figure 2:
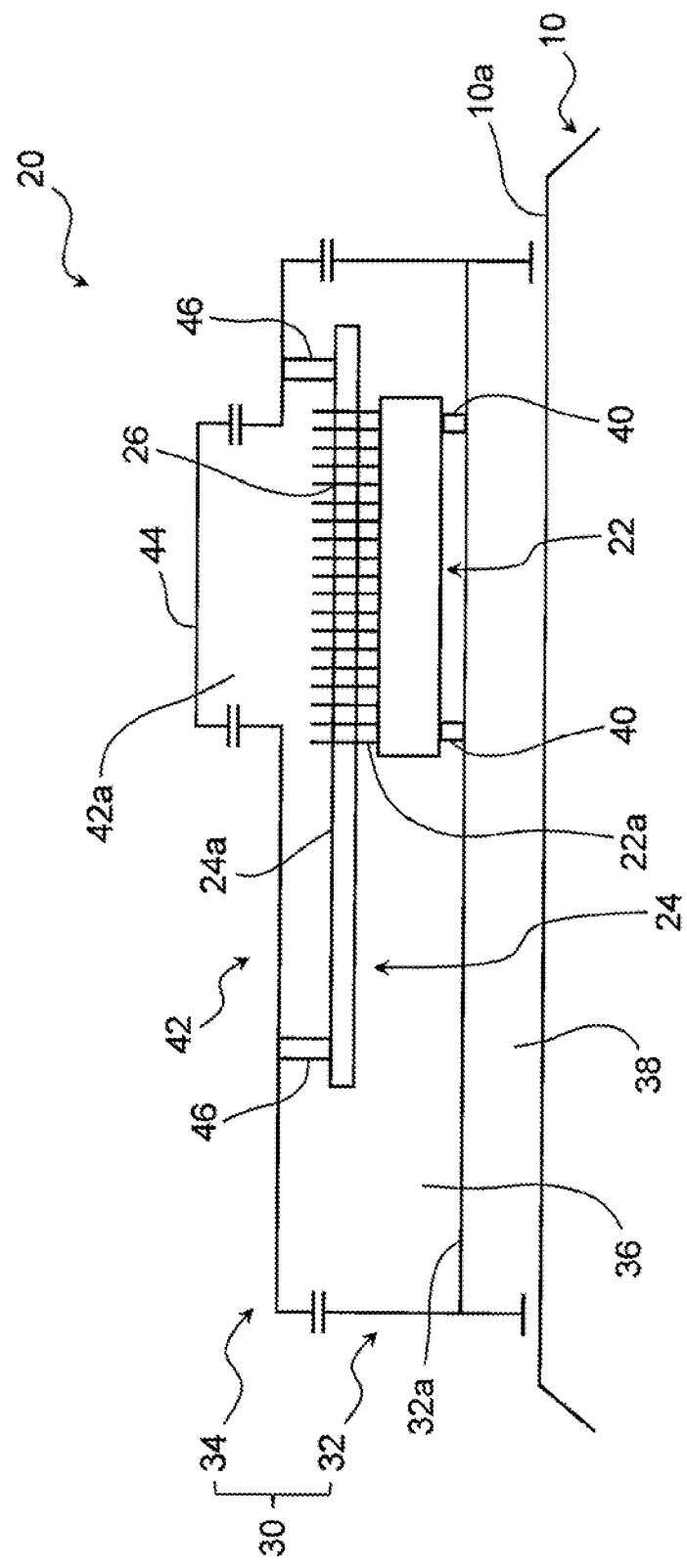
FIG. 2 is a diagram schematically showing the internal structure of the power control unit according to the first embodiment.
Figure 3:
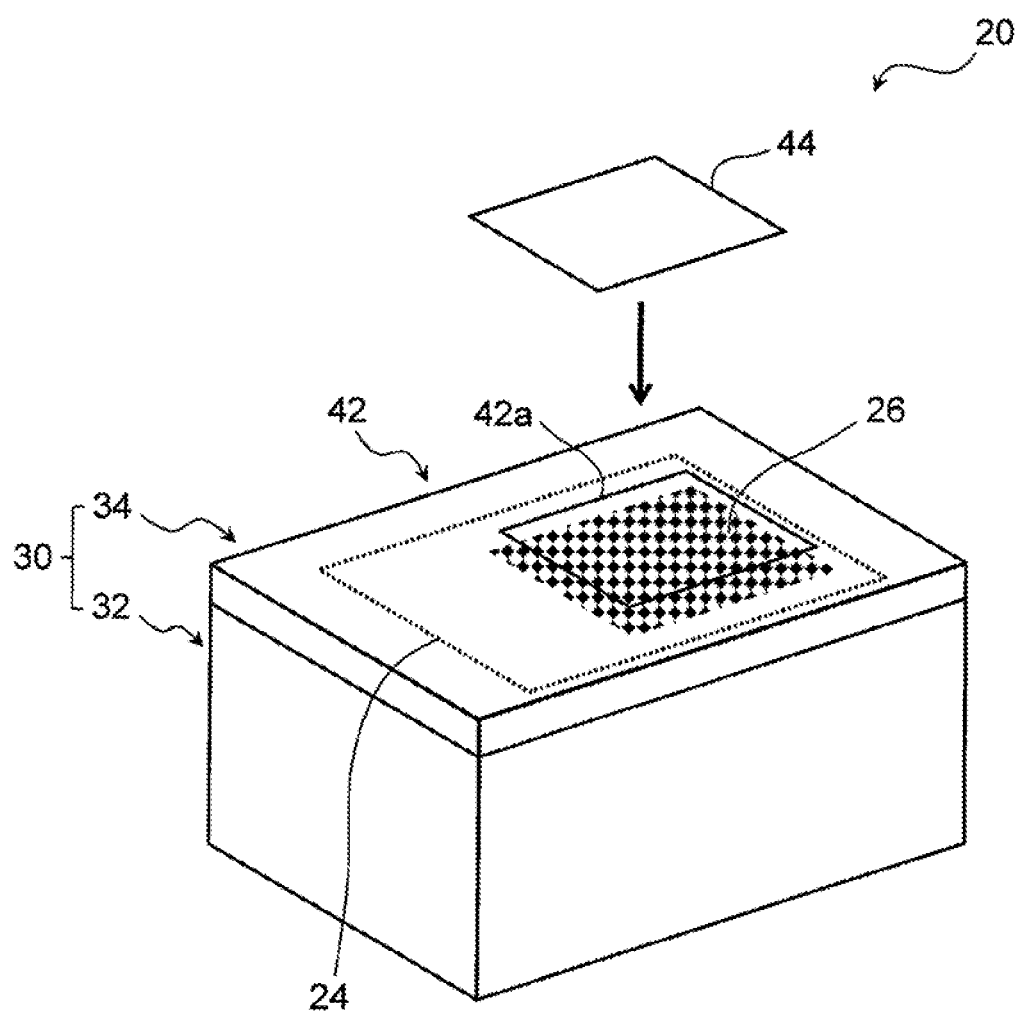
FIG. 3 is a perspective view of the power control unit according to the first embodiment.

FIG. 2 is a diagram schematically showing the internal structure of the PCU 20 according to the first embodiment. FIG. 3 is a perspective view of the PCU 20 according to the first embodiment. As shown in FIGS. 2 and 3, the PCU 20 includes a plurality of semiconductor devices (or semiconductor elements) 22, an electronic circuit board 24 and a power control unit case (PCU case) 30. It should be noted that DC power is supplied from a battery (not shown) to the PCU 20. Additionally, in FIG. 2, the side of an upper surface 10a of the T/A case 10 to which the PCU case 30 is attached is referred to as the lower side of the PCU 20, and the side opposite to the upper surface 10a is referred to as the upper side of the PCU 20.

1-2-1. Internal Structure of PCU and Structure of PCU Case

Each of a plurality of semiconductor devices (hereinafter, also referred to as a "semiconductor module") 22 is a transistor, a diode and a capacitor, and is arranged to perform an electric power control of the electric motor 12 and the generator 14. The electronic circuit board (hereinafter, simply abbreviated as a "circuit board") 24 includes a soldered portion 26 for attaching signal lines 22a of the semiconductor module 22. Typically, the semiconductor module 22 and the circuit board 24 configure an inverter.

The semiconductor module 22 and the circuit board 24 are housed in the PCU case 30. In the example shown in FIGS. 2 and 3, the PCU case 30 is configured by a lower case 32 and an upper cover 34.

To be more specific, in the example shown in FIGS. 2 and 3, the lower case 32 configures most of side surfaces of the PCU case 30. Moreover, the lower case 32 is open at each of the upper surface side and the bottom surface (lower surface) side of the PCU case 30. The upper cover 34 configures the entire upper surface of the PCU case 30 and a part of the side surfaces thereof. That is to say, the opening of the lower case 32 located on the upper surface side of the PCU case 30 is closed by the upper cover 34. It should be noted that, in this example, the bottom surface of the PCU 20 is configured not by the PCU case 30 but by the upper surface 10a of the T/A case 10, but the bottom surface of a PCU according to the present disclosure may be configured by a PCU case 72 as in an example of a PCU 70 according to a second embodiment described below.

As an example, the lower case 32 is provided with a partition plate 32a formed so as to partition the interior of the lower case 32 to an upper space 36 and a lower space 38. Bosses 40 for attaching the semiconductor module 22 to the lower case 32 is formed on the surface of the partition plate 32a located on the side of the upper space 36. The semiconductor module 22 is fixed to the bosses 40 by fasteners, such as screws (not shown). That is to say, the semiconductor module 22 is housed in the interior of the lower case 32 (i.e., the upper space 36). It should be noted that the lower case 32 provided with the partition plate 32a corresponds to an example of the "support member" according to the present disclosure. In addition, unlike this kind of example, a "support member" to which the semiconductor module 22 is attached may be separated from a member to which the upper cover 34 (a first component 42 to be described below) is attached.

The upper cover 34 is configured by two components, that is, the first component 42 and a second component 44. The first component 42 and the second component 44 are formed in a plate shape. In the example shown in FIG. 2, the first component 42 of the upper cover 34 is attached by fasteners (not shown), such as bolts, to a portion of the lower case 32 on the upper surface side. A part of a portion of the first component 42 that configures the upper surface of the PCU case 30 is open as an opening 42a. More specifically, the circumference of the opening 42a is closed. The second component 44 is attached to the first component 42 by fasteners (not shown), such as screws and covers this opening 42a.

Bosses 46 for attaching the circuit board 24 is formed on the surface of the first component 42 located inside the PCU case 30 (more specifically, located on the side of the upper space 36). The circuit board 24 is fixed to the bosses 46 by fasteners (not shown), such as screws. The circuit board 24 fixed in this manner is disposed on the upper side of the semiconductor module 22 (i.e., on the side of the upper cover 34 (the first component 42)) in the interior of the PCU case 30 (i.e., in the upper space 36).

The semiconductor module 22 is arranged such that the signal lines 22a of the individual semiconductor devices extend toward the side of the circuit board 24. These signal lines 22a penetrate the circuit board 24 in a state where the semiconductor module 22 and the circuit board 24 are housed in the PCU case 30. Then, the signal lines 22a are bonded to the circuit board 24 in the soldered portion 26.

Additionally, although not shown, other components of the PCU 20 other than the semiconductor module 22 and the circuit board 24 are arranged inside the PCU case 30. The "other components" mentioned here are, for example, electronic components (such as a reactor) that configure a converter. A capacitor and a processor for communicating with the circuit board 24, for example, also correspond to the "other components". The location of this kind of components can be appropriately determined using the remaining portion of the upper space 36 and the lower space 38.

1-2-2. Difference in Rigidity of Components of Upper Cover

A difference in rigidity is given between the first component 42 forming the upper cover 34 and the second component 44. In detail, the upper cover 34 is configured such that the rigidity of the first component 42 is higher than that of the second component 44. In the present embodiment, this difference in rigidity is given by a difference in material.

To be more specific, for example, metal or resin can be used as the material of the first component 42 and the second component 44. In the present embodiment, the first component 42 (i.e., a higher rigidity portion) is made of aluminum, and the second component 44 (i.e., a lower rigidity portion) is made of resin. As just described, the second component 44 is formed of a material having a lower rigidity than that of the first component 42. It should be noted that, in the present embodiment, as an example, the first and second components 42 and 44 have the same thickness (plate thickness). Also, it is assumed that the first and second components 42 and 44 are not provided with ribs for reinforcement.

In addition, where the difference in rigidity is given by a difference in material, the first component may be formed by using a metal having a relatively high Young's modulus and the second component may be formed by using a metal having a relatively low Young's modulus, instead of the example described above. Alternatively, for example, the first component may be formed using a resin having a relatively high Young's modulus and a second component may be formed using a resin having a relatively low Young's modulus.

Furthermore, according to the present embodiment, the difference in rigidity between the first component 42 and the second component 44 due to the difference in material described above is given as an example in such a manner that a natural vibration frequency $\omega_1$ of the first component 42 is higher than a threshold value $\omega_3$. This threshold value $\omega_3$ corresponds to a lower limit frequency value of an attenuation range associated with the vibration of the second component 44, as will be described below in detail with reference to FIG. 6.

1-2-3. Position Relationship Between Second Component and Soldered Portion

As shown in FIG. 2, the semiconductor module 22 is disposed on the lower side (i.e., the non-upper cover 34 side) with respect to the circuit board 24 attached to the first component 42 of the upper cover 34. Moreover, when viewing the opening 42a from the outer surface side of the first component 42 (i.e., above the first component 42), that is, in the top view of the first component 42, the opening 42a of the first component 42 is formed at a position associated with the soldered portion 26 of the circuit board 24. In addition, as shown in FIG. 2, the soldered portion 26 is arranged on a surface 24a of the circuit board 24 located on the side of the upper cover 34 (in other words, the soldered portion 26 faces the side of the upper cover 34). Furthermore, as shown in FIGS. 2 and 3, the second component 44 covers the soldered portion 26 by closing the opening 42a.

A supplementary explanation will be given on "the configuration in which the second component 44 is arranged to cover the soldered portion 26". As will be described below in detail, soldering in the soldered portion 26 is performed by introducing a tool 4 (see FIG. 4E) toward the circuit board 24 attached to the first component 42 through the opening 42a. Accordingly, the opening 42a and the second component 44 covering the opening 42a is required to be formed such that the tool 48 reaches the whole soldered portions 26. In other words, as long as the opening 42a and the second component 44 are formed to satisfy this kind of requirements, the soldered portion 26 is not required to be wholly visible from the opening 42a in the top view of the first component 42. The size (i.e., the area) of each of the opening 42a and the second component 44 (area) is determined in accordance with the size of the soldered portion 26.

1-3. Method of Assembling PCU

FIGS. 4A to 4E are schematic diagrams used to describe the principal part of the method of assembling the PCU 20 according to the first embodiment. The present assembly method includes the following processes A to B. It should be noted that the assembly of the PCU 20 to the T/A case 10 can be performed by, for example, assembling the lower case 32 to the T/A case 10 before the process A or after the process E.

Figure 4A:
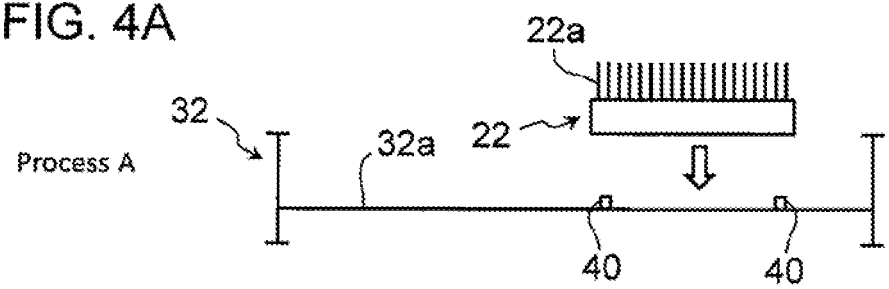
FIG. 4A is a schematic diagram used to describe the principal part of a method of assembling the power control unit according to the first embodiment.
Figure 4B:
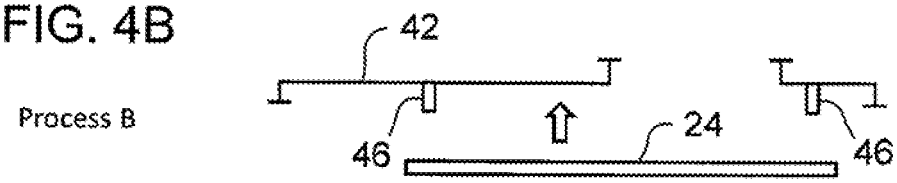
FIG. 4B is a schematic diagram used to describe the principal part of the method of assembling the power control unit according to the first embodiment.

In the process A shown in FIG. 4A, the semiconductor module (the plurality of semiconductor devices) 22 is attached to the lower case 32 (support member). Then, in the process B shown in FIG. 4B, the circuit board 24 is attached to the first component 42. It should be noted that the process B may be performed before the process A.

Figure 4C:
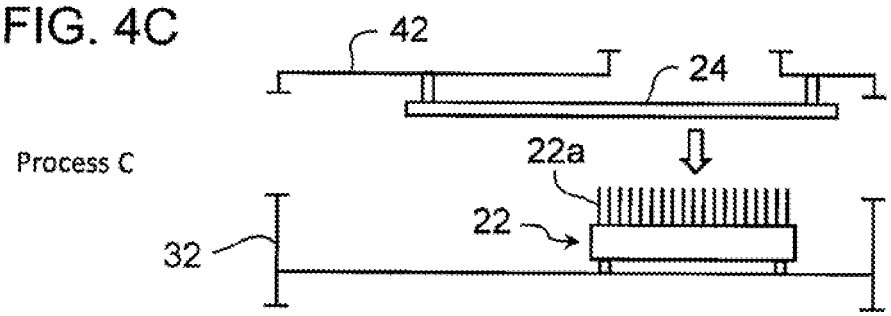
FIG. 4C is a schematic diagram used to describe the principal part of the method of assembling the power control unit according to the first embodiment.

Then, in the process C shown in FIG. 4C, the circuit board 24 attached to the first component 42 is stacked on the semiconductor module 22 attached to the lower case 32 (support member). It should be noted that, in the present embodiment, the "support member" is the same component as the lower case 32 to which the upper cover 34 (first component 42) is attached. Because of this, as a result of performing the process C, the first component 42 is also stacked on the lower case 32. Thereafter, the first component 42 is fixed to the lower case 32.

Figure 4D:
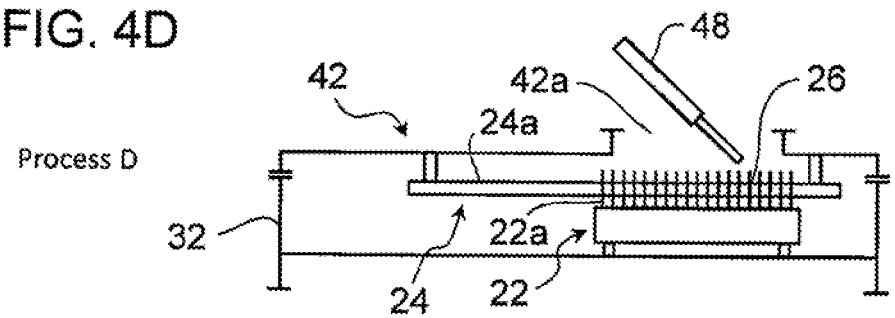
FIG. 4D is a schematic diagram used to describe the principal part of the method of assembling the power control unit according to the first embodiment.

Then, in the process D shown in FIG. 4D, the soldering of the circuit board 24 and the semiconductor module 22 which are stacked by the process C is performed by the use of the tool 48 for the soldering.

Figure 4E:
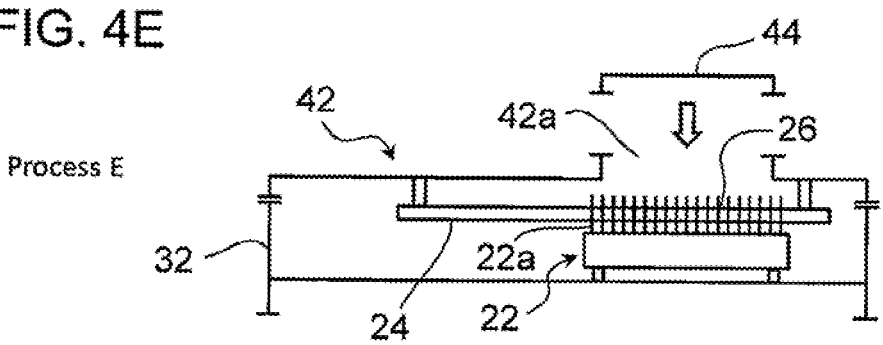
FIG. 4E is a schematic diagram used to describe the principal part of the method of assembling the power control unit according to the first embodiment.

The process E shown in FIG. 4E is performed after the execution of the process D of the soldering. In the process E, the assembly of the second component 44 to the first component 42 is performed.

1-4. Effect

According to the PCU 20 configured as described so far, it is possible to achieve the following vibration reduction effect and the flexibility improvement of the PCU design.

1-4-1. Vibration Reduction Effect (Noise Reduction Effect)

A rotating electrical machine and gears housed in a T/A case vibrate when a vehicle drive unit operates. Those vibrations am propagated to the T/A case and generates vibration and noise as the noise of the rotating electrical machine and the gear noise. If a PCU is disposed on a T/A case as in the PCU 20 according to the present embodiment, the vibration from the T/A case is transmitted to the PCU. As a result, the vibration of a wall surface of the PCU (especially, an upper cover) is easy to be generated by the vibration from the T/A case. This becomes a factor of increasing the vibration and noise generated by the upper cover of the PCU case.

Figure 5:
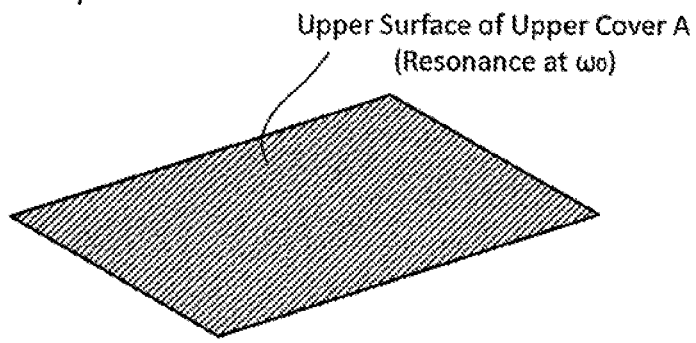
FIG. 5 is a schematic diagram used to describe the resonance of an upper cover A of a power control unit according to a comparative example without measures of the first embodiment.

FIG. 5 is a schematic diagram used to describe the resonance of an upper cover A of a PCU according to a comparative example without the measures of the first embodiment. The upper cover A according to this comparative example has an upper surface having the same area as the upper surface of the upper cover 34 according to the present embodiment, and is configured by a single component unlike the upper cover 34. The natural vibration frequency of the upper cover A is herein referred to as $\omega_0$. The hatching in FIG. 5 indicates a noise emitting surface obtained when the resonance is generated at the natural vibration frequency (i.e., resonance frequency) $\omega_0$ with the vibrations of a rotating electrical machine and gears in a T/A case as the vibration source. As shown in FIG. 5, when this kind of resonance is generated, the entire upper surface of the upper cover A becomes the noise emitting surface. As a result, the vibration and noise with the upper cover A as the sound emitting surface increases.

Figure 6:
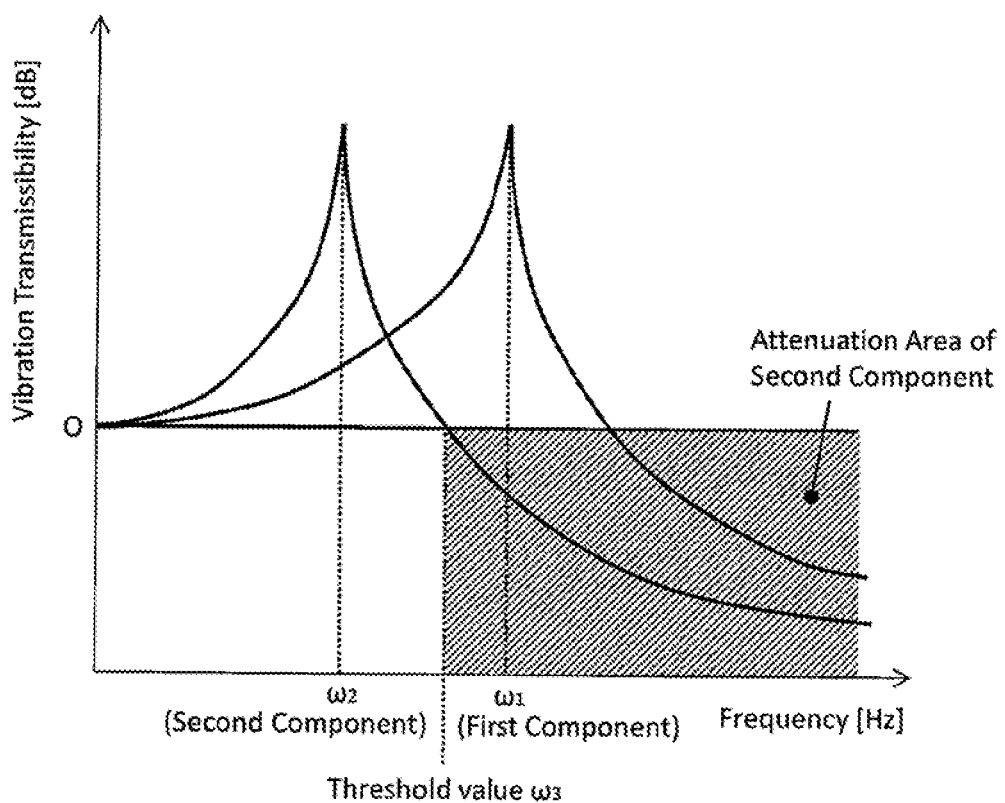
FIG. 6 is a graph showing vibration transmission characteristics of each of a first component and a second component according to the first embodiment.

FIG. 6 is a graph showing the vibration transmission characteristics of each of the first component 42 and the second component 44 according to the first embodiment. The vertical axis of FIG. 6 is a vibration transmissibility (dB) and the horizontal axis is the frequency (Hz). The natural vibration frequency of the first component 42 is herein referred to as $\omega_1$, and the natural vibration frequency of the second component 44 is herein referred to as $\omega_2$. In the PCU 20 according to the present embodiment, the upper cover 34 is divided into two components of the first component 42 and the second component 44, and the difference in rigidity between them is given. Because of this, the natural vibration frequencies (resonant frequencies) $\omega_1$ and $\omega_2$ of the first and second components 42 and 44 differ from each other. To be more specific, as shown in FIG. 6, the resonance frequency $\omega_1$ of the first component 42 on the higher rigidity side is higher than the resonance frequency $\omega_2$ of the second component 44 on the lower rigidity side. With respect to the vibration transmission characteristics of the second component 44, the hatching area shown in FIG. 6 corresponds to an attenuation area where the vibration transmissibility of the second component 44 becomes equal to or less than 0 dB (i.e., where the ratio of the output to the input of the vibration becomes 1 times or less). The threshold value $\omega_3$ corresponds to the lower limit frequency value of this attenuation area.

Figure 7A:
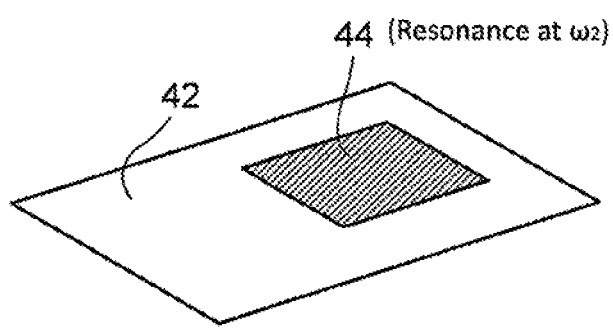
FIG. 7A is a schematic diagram used to describe the resonance of the upper cover according to the first embodiment at a natural vibration frequencies $\omega_2$.
Figure 7B:
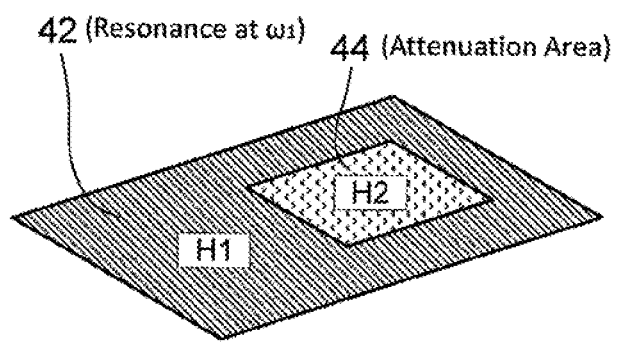
FIG. 7B is a schematic diagram used to describe the resonance of the upper cover according to the first embodiment at a natural vibration frequencies $\omega_1$.

Next, FIGS. 7A and 7B are schematic diagrams used to describe the resonances of the upper cover 34 according to the first embodiment at the natural vibration frequencies $\omega_2$ and $\omega_1$, respectively. More particularly, the hatching shown in FIG. 7A indicates a noise emitting surface obtained when the resonance is generated at the natural vibration frequency $\omega_2$ of the second component 44 with, as the vibration source, the vibrations of the rotating electrical machines (the electric motor 12 and the generator 14) and the gears (the power split device 16 and the differential gear 18) in the T/A case 10. When this kind of resonance is generated, the entire second component 44 becomes the noise emitting surface. On the other hand, a hatching H1 shown in FIG. 7B indicates a noise emitting surface obtained when the resonance is generated at the natural vibration frequency et of the first component 42 with, as the vibration source, the same vibrations described above. If this kind of resonance is generated, the entire first component 42 becomes the noise emitting surface.

(Vibration Reduction Effect 1)

As described above, according to the PCU 20 of the present embodiment, the upper cover 34 is divided into two components by the first component 42 and the second component 44, and the difference in rigidity is given between the two components. Because of this, the natural vibration frequencies (resonance frequencies) $\omega_1$ and $\omega_2$ of the first and second components 42 and 44 can be dispersed. As a result, as can be seen when comparing each of FIGS. 7A and 7B with FIG. 5, the vibration area at the resonances at the respective natural vibration frequencies $\omega_1$ and $\omega_2$ (i.e., the area of the noise emitting surface) can be reduced as compared to the vibration area at the resonance at the natural vibration frequency $\omega_0$ in the comparative example. Therefore, as compared to the comparative example, it is possible to reduce the vibration and noise with the upper cover as the vibration emitting surface (vibration reduction effect 1).

(Vibration Reduction Effect 2)

Moreover, according to the configuration of the PCU 20 of the present embodiment, not only the vibration reduction effect 1 described above but also the "vibration reduction effect 2" based on the following viewpoints can be obtained. That is to say, as described above, the resonance frequency $\omega_1$ of the first component 42 on the higher rigidity side is higher than the resonance frequency $\omega_2$ of the second component 44 on the lower rigidity side. Also, in the present embodiment the above described difference in rigidity is given in such a manner that the natural vibration frequency $\omega_1$ of the first component 42 becomes higher than the threshold value $\omega_3$ (i.e., the lower limit frequency value of the attenuation area of the second component).

Accordingly, when the resonance of the first component 42 on the higher rigidity side is generated, the vibration transmissibility of the second component 44 on the lower rigidity side which has already entered the attenuation am becomes lower than 1 times (i.e., the output of the vibration becomes smaller than the input). That is, the attenuation effect of the vibration is obtained on the surface of the second component 44 which is hatched H2 in FIG. 7B. Since the amplification of the vibration in the first component 42 can be reduced by the kind of attenuation effect of the vibration by the second component 44, so that the overall vibration of the upper cover 34 can be effectively reduced (vibration reduction effect 2). More specifically, as a result of the vibration being effectively reduced at the time of the resonance of the first component 42, the vibration of the circuit board 24 attached to the first component 42 is also effectively reduced.

As described so far, according to the configuration of the PCU 20 of the present embodiment, it is possible to effectively reduce the vibration and noise of the upper cover 34 not only by using the vibration reduction effect 1 but also by using the vibration reduction effect 2. In addition, in a PCU having an upper cover configured by a single component, a vibration reduction measure of increasing the rigidity of the upper cover to increase the resonance frequency results in an increase in the weight of the upper cover. Further, another vibration reduction measure by adding a sound insulation material leads to an increase in cost. In contrast, according to the present embodiment, it is possible to perform vibration reduction measures while reducing an increase in weight and cost of the upper cover.

It should be noted that, instead of the example of the first embodiment, the above described difference in rigidity may be given in such a manner that the natural vibration frequency of the first component becomes equal to or less than the above described threshold value $\omega_3$. This kind of example also achieves the vibration reduction effect 1.

1-4-2. Increase of Flexibility of PCU Design

Figure 8A:
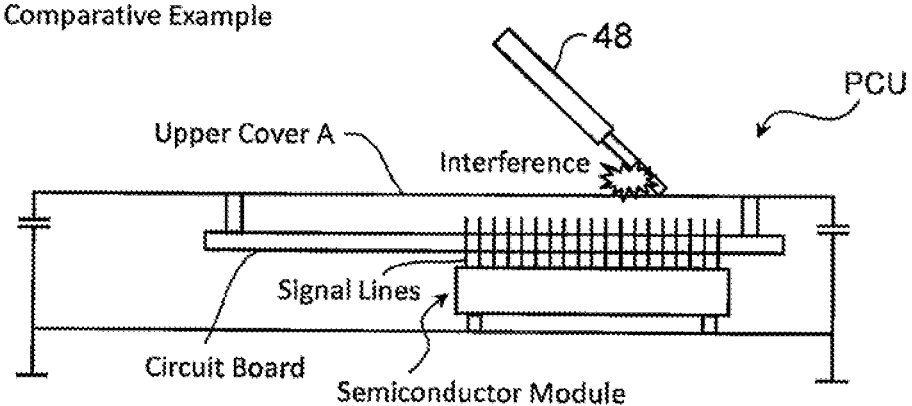
FIG. 8A is a schematic diagram used to describe an issue of a comparative example associated with the upper cover A shown in FIG. 5.
Figure 8B:
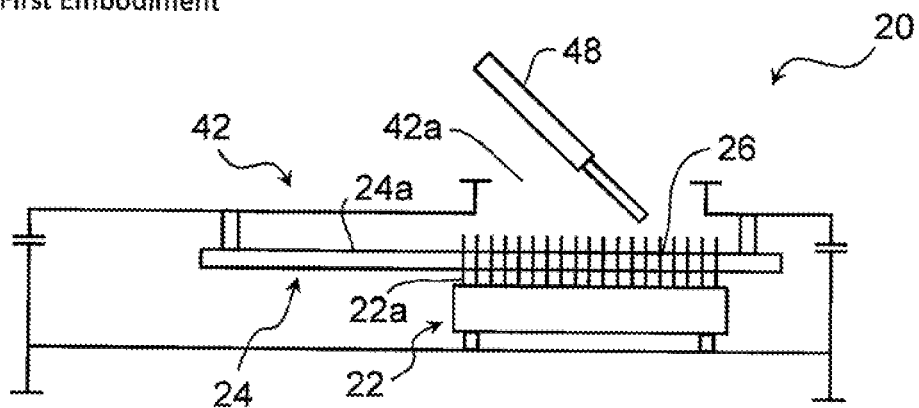
FIG. 8B is a schematic diagram used to describe an effect achieved by the configuration of the power control unit according to the first embodiment.

FIG. 8A is a schematic diagram used to describe an issue of a comparative example associated with the upper cover A shown in FIG. 5, and FIG. 8B is a schematic diagram used to describe an effect achieved by the configuration of the PCU 20 according to the first embodiment.

A PCU according to the comparative example shown in FIG. 8A includes the upper cover A configured by a single component. Also, in this comparative example, similarly to the PCU 20 according to the first embodiment, a circuit board is attached to the upper cover A, and a soldered portion with a semiconductor module is arranged on the surface of the circuit board located on the side of the upper cover A. In this kind of comparative example, when attempting to perform the soldering after attaching the upper cover A to a lower case, as shown in FIG. 8A, the tool 48 of the soldering interferes with the upper cover A. That is to say, in the comparative example, it is impossible to adopt a structure to attach the circuit board to the upper cover A before stacking the semiconductor module on the circuit board.

On the other hand, the PCU 20 according to the present embodiment has a structure in which the second component 44 independent from the first component 42 covers the soldered portion 26 located on the surface 24a on the upper cover 34 side in the circuit board 24 attached to the first component 42. As a result, it is possible to perform the soldering work of the soldered portion 26 from the outer surface side of the upper cover 34 by the use of the opening 42a of the first component 42 as shown in FIG. 8B after the circuit board 24 is attached to the first component 42 and the semiconductor module 22 is stacked on the circuit board 24 (in other words, the first component 42 to which the circuit board 24 is attached is assembled to the lower case 32). Furthermore, it is possible to adopt a structure of assembling the second component 44 to the first component 42 thereafter.

As described so far, according to the PCU 20 of the present embodiment, it is possible to adopt a structure in which the circuit board 24 is attached to the upper cover 34 (the first component 42) prior to stacking the semiconductor module 22 on the circuit board 24. As a result, it is possible to adopt a structure in which the circuit board 24 is attached to the upper cover 34 (the first component 42) while the semiconductor module 22 is attached to the support member (e.g., the lower case 32). In other words, according to the PCU 20, a new option can be provided with respect to the arrangement of components incorporated into the PCU case 30, and the flexibility in the PCU design can be increased. Furthermore, the first component 42 to which the circuit board 24 is attached is a component on the higher rigidity side in the upper cover 34. Therefore, it is possible to adopt a structure in which the circuit board 24 is attached to the upper cover 34 while the circuit board 24 is firmly supported by the first component 42 on the higher rigidity side.

Additionally, according to the PCU 20 of the present embodiment, it is possible to attach the circuit board 24 having the soldered portion 26 to the upper cover 34 (the first component 42). As a result, for example, the space inside the PCU 20 can be effectively utilized.

1-5. Modification Examples of First Embodiment

According to the first embodiment described above, the difference in rigidity between the first component 42 and the second component 44 is given by the use of the difference in the materials of them. On the other hand, as in the following first and second modification examples, the difference in rigidity may be given by the use of a difference in shape.

Figure 9:
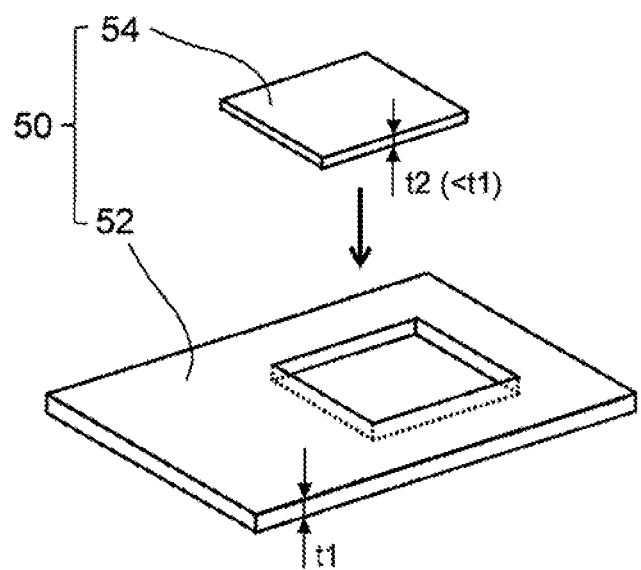
FIG. 9 is a schematic diagram used to describe a configuration of an upper cover according to a first modification example of the first embodiment.

FIG. 9 is a schematic diagram used to describe a configuration of an upper cover 50 according to the first modification example of the first embodiment. The upper cover 50 shown in FIG. 9 includes a first component 52 to which the circuit board 24 is attached, and a second component 54 configured to cover the soldered portion 26. As an example, it is assumed that the first component 52 and the second component 54 are made of the same material.

On that basis, the first component 52 and the second component 54 are formed such that the thickness (plate thickness) t2 of the second component 54 becomes smaller than the thickness t1 of the first component 52. The first modification example as just described can also increase the rigidity of the first component 52 than the rigidity of the second component 54.

Figure 10:
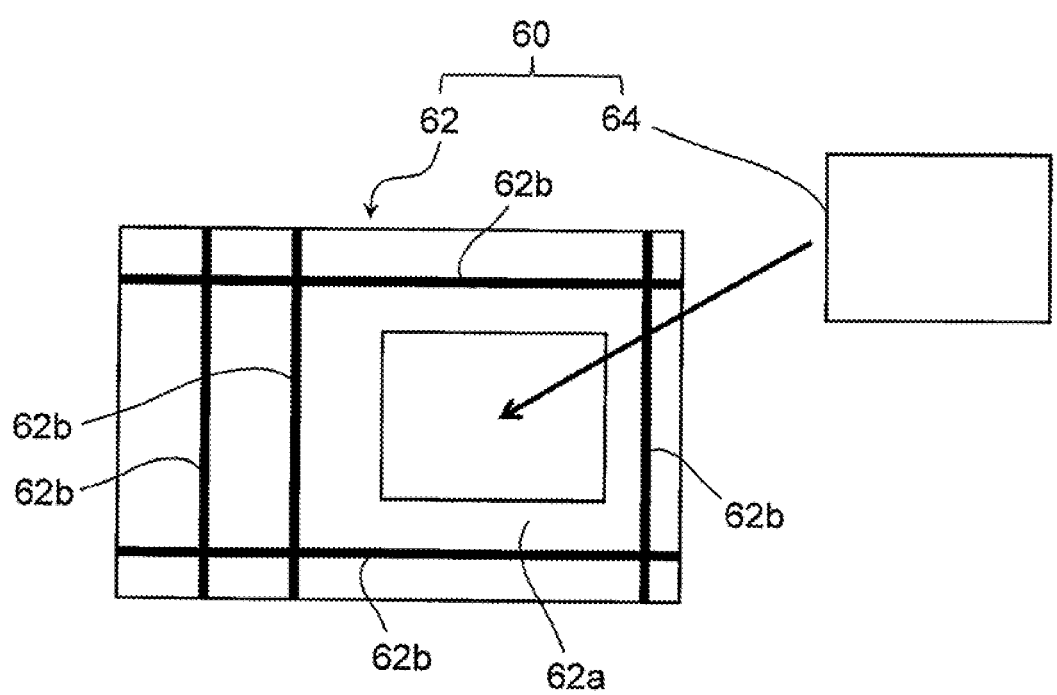
FIG. 10 is a schematic diagram used to describe a configuration of an upper cover according to a second modification example of the first embodiment.

FIG. 10 is a schematic diagram used to describe a configuration of an upper cover 60 according to a second modification example of the first embodiment. The upper cover 60 shown in FIG. 10 includes a first component 62 to which the circuit board 24 is attached, and a second component 64 configured to cover the soldered portion 26. As an example, it is assumed that the first component 62 and the second component 64 are made of the same material.

On that basis, as shown in FIG. 10, the surface (e.g., an inner surface 62a (a surface on the circuit board 24 side)) of the plate-shaped first component 62 has ribs 62b for increasing the rigidity of the first component 62. On the other hand, this kind of ribs are not provided on the surface of the second component 64. The second modification example as just described can also increase the rigidity of the first component 62 than the rigidity of the second component 64. It should be noted that, in other examples of using a rib to provide a difference in rigidity, as long as the rigidity of the first component is higher than that of the second component, the rib may be provided not only for the first component but also for the second component.

The above described difference in rigidity may be given by the use of both the difference in material and the difference in shape. It should be noted that, when using both the difference in material and the difference in shape, the Young's modulus of the first component may not always be higher than that of the second component (e.g., an example of combination of a first component formed using a relatively thick plate of aluminum and a second component formed using a relatively thin plate of iron).

2. Second Embodiment

Figure 11:
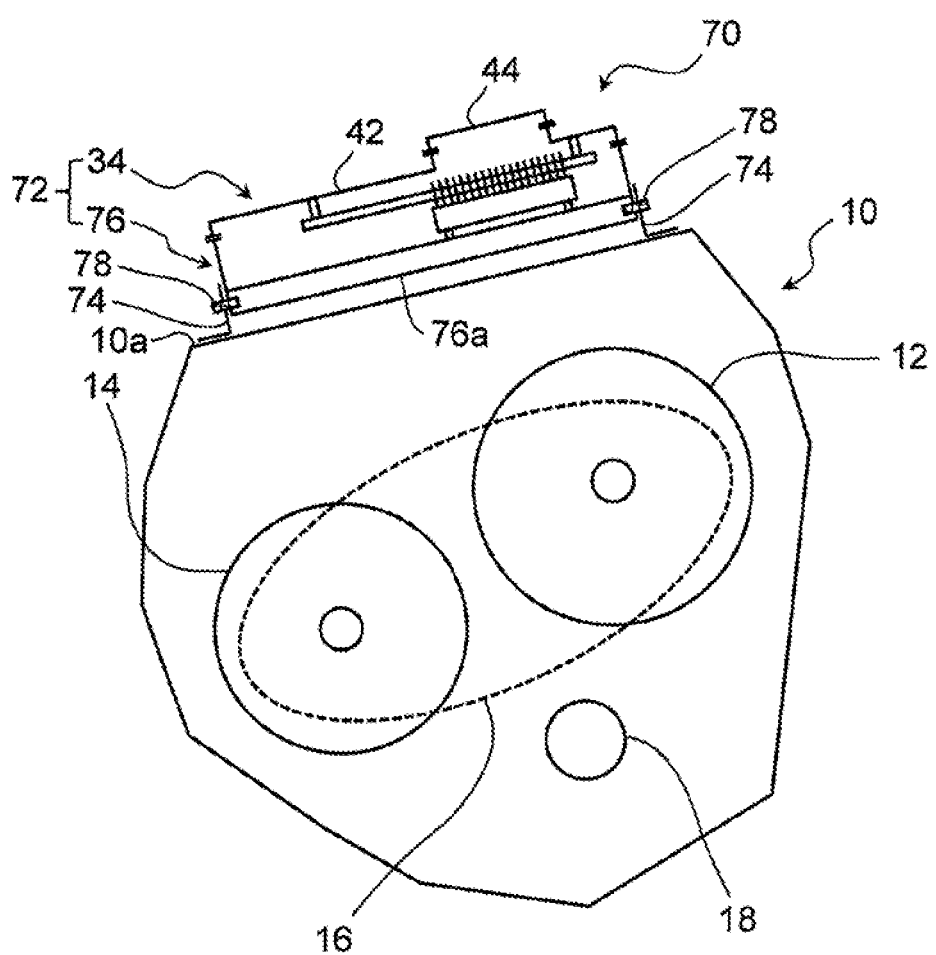
FIG. 11 is a diagram schematically showing an example of a mounting structure of a power control unit according to a second embodiment of the present disclosure.

Next, a second embodiment according to the present disclosure will be described with reference to FIG. 11. FIG. 11 is a diagram schematically showing an example of a mounting structure of a power control unit 70 according to the second embodiment. The PCU 70 according to the present embodiment is also disposed on the T/A case 10 in the same manner as the PCU 20 according to the first embodiment.

According to the first embodiment described above, the PCU case 30 of the PCU 20 is directly fastened to the upper surface 10a of the T/A case 10. In contrast, as shown in FIG. 9, a PCU case 72 of the PCU 70 according to the present embodiment is attached to the upper surface a of the T/A case 10 via brackets 74.

As shown in FIG. 11, the PCU case 72 includes a lower case 76 together with the upper cover 34 having the same configuration as that of the first embodiment. The lower case 76 is configured similarly to the lower case 32 according to the first embodiment except that the lower case 76 includes a bottom surface 76a. Then, inside the PCU case 72, the semiconductor module 22 and the circuit board 24 having the soldered portion 26 are disposed while using the similar structure to the PCU case 30.

Additionally, in the example shown in FIG. 11, in order to properly reduce the transmission of the vibration from the T/A case 10 to the PCU case 72, the brackets 74 support the PCU case 72 (the lower case 76) via rubber bushings 78. In addition, in FIG. 11, illustration of fasteners for attaching the PCU case 72 to the T/A case 10 via the brackets 74 is omitted.

The PCU 70 mounted on the T/A case 10 via the brackets 74 as described above also makes it possible to achieve the vibration reduction effects 1 and 2 and an increase in flexibility of the PCU design, similarly to the PCU 20 according to the first embodiment.

3. Other Embodiments

Next, other embodiments will be described with reference to FIGS. 12 to 14.

3-1. Other Examples of Transaxle Case with PCU

Figure 12:
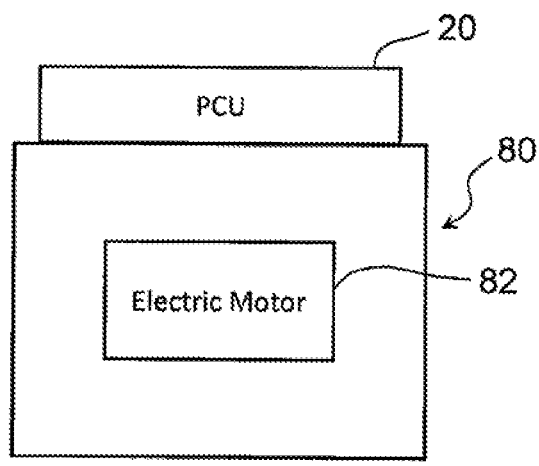
FIG. 12 is a schematic diagram used to describe another example of a transaxle case.

FIG. 12 is a schematic diagram used to describe another example of the T/A case. A PCU (e.g., the PCU 20) is disposed on a T/A case 80 shown in FIG. 12. In this example, the T/A case 80 houses a rotating electrical machine 82 without housing gears. The rotating electrical machine 82 is an electric motor as an example, but may be a generator or a motor generator. According to the power control unit of the present disclosure, even in the example of this kind of T/A case 80, it is possible to increase the flexibility of the PCU design while reducing the vibration from the rotating electrical machine 82.

Figure 13:
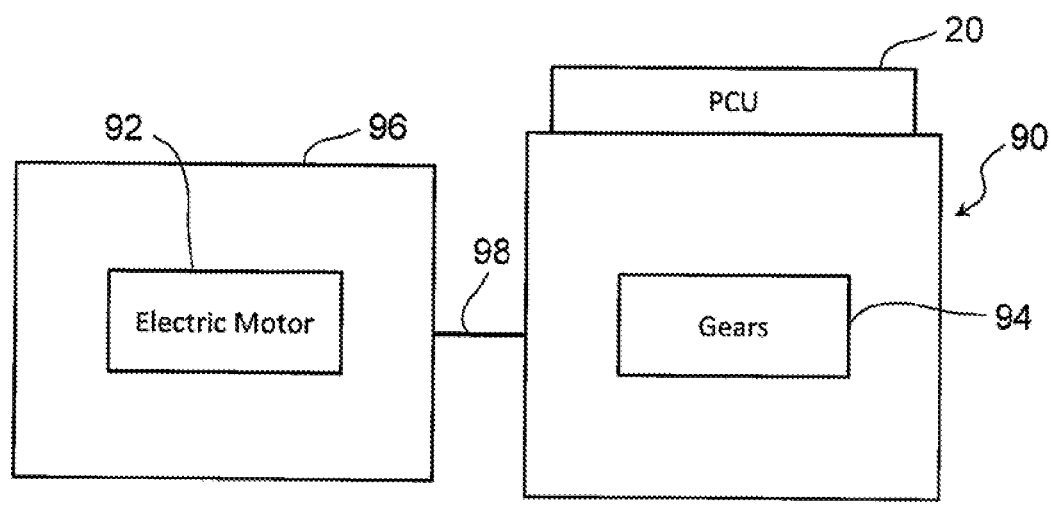
FIG. 13 is a schematic diagram for explaining another example of the transaxle case.

FIG. 13 is a schematic diagram for explaining another example of the T/A case. A PCU (e.g., the PCU 20) is disposed on a T/A case 90 shown in FIG. 13. In this example, the T/A case 90 houses gears 94 without housing a rotating electrical machine 92. The gears 94 are, for example, one or both of a transmission gear and a differential gear. The rotating electrical machine 92 is an electric motor as an example, but may be a generator or a motor generator. It should be noted that the rotating electrical machine 92 is housed in a separate motor case 96 from the T/A case 90. Moreover, the rotating electrical machine 92 is coupled to the gears 94 via a transmission member (e.g., chain) 98. According to the power control unit of the present disclosure, even in the example of this kind of T/A case 90, it is possible to increase the flexibility of the PCU design while reducing the vibration from the gears 94.

3-2. Other Examples of Configuration of Upper Cover

As shown in FIGS. 2 and 3, the upper cover 34 according to the first embodiment configures the entire upper surface of the PCU case 30. However, the "upper cover" according to the present disclosure may not always configure the entire upper surface of a PCU case. That is to say, the upper cover (first component and one or more second components) may configure a part of the upper surface of a PCU case. More specifically, other portions of the upper surface of the PCU case may be configured by, for example, a lower case that houses one or more PCU components other than a circuit board.

Also, as shown in FIGS. 2 and 3, the upper cover 34 configures a pan of side surfaces of the PCU case 30 in addition to the upper surface thereof. However, the "upper cover" according to the present disclosure may configure only the upper surface of the PCU case. Alternatively, the upper cover may configure the whole or a part of at least one of a plurality of side surfaces of the PCU case together with at least a part of the upper surface of the PCU case.

Moreover, as shown in FIG. 3, in the upper cover 34, the first component 42 has the opening 42a the circumference of which is closed, and the second component 44 is disposed so as to cover this opening 42a. That is to ay, in the upper cover 34, only the first component 42 is fastened to the lower case 32. However, in the "upper cover" according to the present disclosure, the first component and the second component may be divided in, for example, a manner as shown in FIG. 14.

Figure 14:
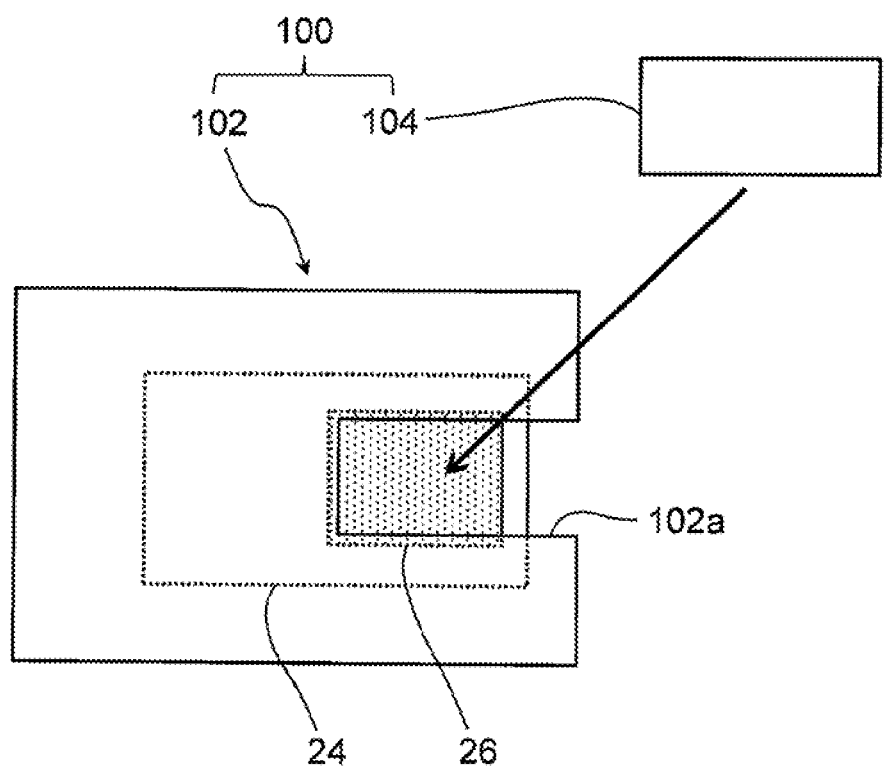
FIG. 14 is a schematic diagram used to describe another example of the upper cover.

FIG. 14 is a schematic diagram used to describe another example of the upper cover. An upper cover 100 shown in FIG. 14 includes a first component 102 and a second component 104. In this example, the first component 102 has an opening 102a the circumference of which is not closed. Also, the second component 104 is disposed so as to cover this opening 102a. In addition, in this kind of example, the second component 104 may be fastened to at least one of a member to which the upper cover 100 is attached (e.g., the lower case 32) and the first component 102 using fasteners (not shown).

Furthermore, as shown in FIG. 3, the number of the second component 44 included in the upper cover 34 is one. However, the "upper cover" according to the present disclosure may include a plurality of second components. More specifically, in an example with a plurality of second components, the rigidity of the plurality of second components may be the same as each other or different from each other. By making the rigidity different between the plurality of second components, it becomes possible to disperse the resonant frequencies of the respective components of the upper cover including the first component into three or more. As a result, the vibration reduction effect of the upper cover can be further enhanced. Furthermore, in the example with a plurality of second components, any one of the plurality of second components may cover the soldered portion, or a plurality of (including all) of the plurality of second components may cover the soldered portion. In addition, there may be a plurality of pairs of the soldered portion and the second component that covers the soldered portion.

3-3. Another Example of Configuration of PCU Case

In the example of the PCU case 30 shown in FIGS. 2 and 3, the lower case 32 (support member) is formed independently of the T/A case 10. However, at least one of the one or more members (including the "support member") other than the upper cover forming the "PCU case" according to the present disclosure may be formed integrally and continuously with the "transaxle case" (i.e., without the joining surface between them).

The embodiments and modification examples described above may be combined in other ways than those explicitly described above as required and may be modified in various ways without departing from the scope of the present disclosure.

What is claimed is:

1. A power control unit applied to an electrified vehicle driven by a vehicle drive unit including a transaxle case that houses at least one of a rotating electrical machine and gears, the power control unit being disposed on the transaxle case, the power control unit comprising:
    a plurality of semiconductor devices configured to perform an electric power control of the rotating electrical machine;
    an electronic circuit board including a soldered portion for attaching the plurality of semiconductor devices to the electronic circuit board; and
    a power control unit case (PCU case) formed to house the plurality of semiconductor devices and the electronic circuit board, the PCU case including a support member to which the plurality of semiconductor devices are attached, and an upper cover that forms at least a part of an upper surface of the PCU case, the upper cover including a first component and one or more second components having a lower rigidity than the first component, the electronic circuit board being attached to the first component, the soldered portion being arranged on a surface of the electronic circuit board located on a side of the upper cover, at least one of the one or more second components being arranged to cover the soldered portion, wherein the first component includes a portion forming the upper surface of the upper cover of the PCU case, and a part of the portion includes an opening on the upper surface of the upper cover, and the one or more second components covers the opening.

2. The power control unit according to claim 1,
wherein a difference in rigidity between the first component and the one or more second components is given in such a manner that a natural vibration frequency of the first component is higher than a threshold value, and
wherein the threshold value is a lower limit frequency value of an attenuation area in which a vibration transmissibility of the one or more second components is less than or equal to 0 dB.

3. The power control unit according to claim 1,
wherein the one or more second components are formed of a material having a lower rigidity than that of the first component.

4. The power control unit according to claim 1,
wherein the one or more second components have a smaller thickness than the first component.

5. The power control unit according to claim 1,
wherein the first component includes a rib configured to increase rigidity of the first component while the one or more second components do not include ribs to increase rigidity of the one or more second components.

6. A method of assembling a power control unit applied to an electrified vehicle driven by a vehicle drive unit including a transaxle case that houses at least one of a rotating electrical machine and gears, the power control unit being disposed on the transaxle case, the power control unit including a plurality of semiconductor devices configured to perform an electric power control of the rotating electrical machine, an electronic circuit board including a soldered portion for attaching the plurality of semiconductor devices to the electronic circuit board, and a power control unit case (PCU case) that houses the plurality of semiconductor devices and the electronic circuit board, and an upper cover that forms at least a part of an upper surface of the PCU case, the upper cover including a first component and one or more second components having a lower rigidity than the first component, wherein the first component includes a portion that forms the upper surface of the upper cover of the PCU case, and a part of the portion includes an opening on the upper surface, comprising:

attaching the plurality of semiconductor devices to a support member of the PCU case;

attaching the electronic circuit board to the first component;

stacking the electronic circuit board attached to the first component and the plurality of semiconductor devices attached to the support member;

performing soldering of the electronic circuit board and the plurality of semiconductor devices which have been stacked, the soldered portion being arranged on a surface of the electronic circuit board located on a side of the upper cover; and assembling the one or more second components with the first component after the soldering, so that the one or more second components covers the opening and covers the soldered portion.

* * * * *